United States Patent
Wen et al.

(10) Patent No.: US 11,205,999 B2
(45) Date of Patent: Dec. 21, 2021

(54) AMPLIFIER WITH SIGNAL DEPENDENT MODE OPERATION

(71) Applicant: MEDIATEK INC., Hsin-Chu (TW)

(72) Inventors: Sung-Han Wen, Hsinchu (TW); Kuan-Ta Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 9 days.

(21) Appl. No.: 16/935,142

(22) Filed: Jul. 21, 2020

(65) Prior Publication Data

US 2021/0119589 A1  Apr. 22, 2021

Related U.S. Application Data

(60) Provisional application No. 62/924,250, filed on Oct. 22, 2019.

(51) Int. Cl.
  *H03F 3/217* (2006.01)
  *H03M 1/66* (2006.01)
  (Continued)

(52) U.S. Cl.
  CPC ............. *H03F 3/217* (2013.01); *H03M 1/66* (2013.01); *H04L 27/122* (2013.01); *H04R 3/00* (2013.01); *H03F 2200/03* (2013.01)

(58) Field of Classification Search
  CPC ...... H03F 3/217; H03F 2200/03; H03M 1/66; H04L 27/122; H04R 3/00
  See application file for complete search history.

(56) References Cited

U.S. PATENT DOCUMENTS

| 6,396,933 B1* | 5/2002 | Jung ..................... H03F 1/0277 381/96 |
| 9,143,088 B2 | 9/2015 | Sorrells |

(Continued)

FOREIGN PATENT DOCUMENTS

TW  201547190 A  12/2015

OTHER PUBLICATIONS

Chien, "A Low Quiescent Current, Low THD+N Class-D Audio Amplifier With Area-Efficient PWM-Residual-Aliasing Reduction", IEEE Journal of Solid-State Circuits, vol. 53, No. 12, Dec. 2018.
(Continued)

*Primary Examiner* — David L Ton
(74) *Attorney, Agent, or Firm* — Winston Hsu

(57) ABSTRACT

The present invention provides an amplifier including a DAC, an analog signal processing circuit, a digital signal processing circuit, a signal detector and a driving stage is disclosed. The DAC is configured to perform a digital-to-analog conversion operation on a digital input signal to generate an analog input signal. The analog signal processing circuit is configured to generate a first processed signal according to the analog input signal and a feedback signal. The digital signal processing circuit is configured to process the digital input signal to generate a second processed signal. The signal detector is configured to detect strength of the digital input signal to generate a mode selection signal. The driving stage is configured to refer to the mode selection signal to receive one of the first processed signal and the second processed signal to generate an output signal, wherein the feedback signal is generated by the output signal.

16 Claims, 5 Drawing Sheets

(51) Int. Cl.
*H04L 27/12* (2006.01)
*H04R 3/00* (2006.01)

(56) References Cited

U.S. PATENT DOCUMENTS

| | | | |
|---|---|---|---|
| 9,173,020 | B2 | 10/2015 | Cheng |
| 10,044,323 | B1 * | 8/2018 | He ................... H03F 3/45475 |
| 2002/0167354 | A1 * | 11/2002 | Stanley ............. H03F 3/2175 330/10 |
| 2004/0266366 | A1 * | 12/2004 | Robinson ............ H03F 1/3241 455/91 |
| 2011/0012674 | A1 * | 1/2011 | Midya .................. H03F 3/217 330/10 |
| 2016/0118948 | A1 | 4/2016 | Zanbaghi |
| 2016/0126908 | A1 * | 5/2016 | King ................... H03F 1/0277 330/251 |
| 2018/0159490 | A1 | 6/2018 | Lesso |
| 2019/0149101 | A1 * | 5/2019 | He ..................... H03F 3/2173 330/251 |
| 2019/0260365 | A1 | 8/2019 | He |

OTHER PUBLICATIONS

Wang, "A 118 dB PSRR, 0.00067% (−103.5 dB) THD+N and 3.1 W Fully Differential Class-D Audio Amplifier With PWM Common Mode Control", IEEE Journal of Solid-State Circuits, vol. 51, No. 12, Dec. 2016.

Wang, "A 120 dB Dynamic Range 400 mW Class-D Speaker Driver With Fourth-Order PWM Modulator", IEEE Journal of Solid-State Circuits, vol. 45, No. 8, Aug. 2010.

* cited by examiner

AMPLIFIER WITH SIGNAL DEPENDENT MODE OPERATION

CROSS REFERENCE TO RELATED APPLICATIONS

This application claims the priority of U.S. Provisional Application No. 62/924,250, filed on Oct. 22, 2019, which is included herein by reference in its entirety.

BACKGROUND

A class-D amplifier is generally applied to an audio system to generate an output audio signal to drive a speaker. The class-D amplifier generally has a closed-loop design, that is the output signal also serves as a feedback signal inputted into a loop filter within the class-D amplifier. The class-D amplifier with closed-loop design has advantages such as superior power supply rejection ratio (PSRR) and left/right channel crosstalk, better jitter immunity of pulse-width modulation (PWM) clock, large dead-time and lower gate driver slew rate, and superior total harmonic distortion (THD), but the class-D amplifier with closed-loop design has disadvantage such as large quiescent current.

In addition, efficiency of the closed-loop class-D amplifier degrades seriously at small input/output power because of the quiescent power of the analog circuit blocks. For example, when the output power of the class-D amplifier is 2.0 milliwatt (mW), the efficiency may be 90%; and when the output power of the class-D amplifier is 0.1 mW, the efficiency may drop to 10%. In some applications such as a cellphone, a user may turn on a loudspeaker or use an earphone or headset to listen to music. The closed-loop class-D amplifier may work well for the user using the loudspeaker with higher output power, but the efficiency may be degraded with small output power.

SUMMARY

It is therefore an objective of the present invention to provide an amplifier, which operates in a closed-loop mode when the input signal has large power to improve performance, and operates in an open-loop mode when the input signal has small power to reduce quiescent current and improve efficiency, to solve the above-mentioned problems.

According to one embodiment of the present invention, an amplifier comprising a digital-to-analog converter (DAC), an analog signal processing circuit, a digital signal processing circuit, a signal detector and a driving stage is disclosed. The DAC is configured to perform a digital-to-analog conversion operation on a digital input signal to generate an analog input signal. The analog signal processing circuit is configured to generate a first processed signal according to the analog input signal and a feedback signal. The digital signal processing circuit is configured to process the digital input signal to generate a second processed signal. The signal detector is configured to detect strength of the digital input signal to generate a mode selection signal. The driving stage is configured to refer to the mode selection signal to receive one of the first processed signal and the second processed signal to generate an output signal, wherein the feedback signal is generated according to the output signal.

According to another embodiment of the present invention, a method for controlling an amplifier is disclosed, wherein the amplifier comprises a DAC, an analog signal processing circuit, a digital signal processing circuit and a driving stage, and the method comprises the steps of: detecting strength of a digital input signal to generate a mode selection signal indicating a closed-loop mode or an open-loop mode; when the mode selection signal indicates the closed-loop mode: enabling the DAC to perform an analog-to-digital conversion operation on the digital input signal to generate an analog input signal; enabling the analog signal processing circuit to receive the analog input signal and a feedback signal to generate a first processed circuit; and using the driving stage to receive the first processed signal to generate an output signal, wherein the feedback signal is generated according to the output signal; and when the mode selection signal indicates the open-loop mode: enabling the digital signal processing circuit to receive the digital input signal to generate a second processed signal; and using the driving stage to receive the second processed signal to generate the output signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
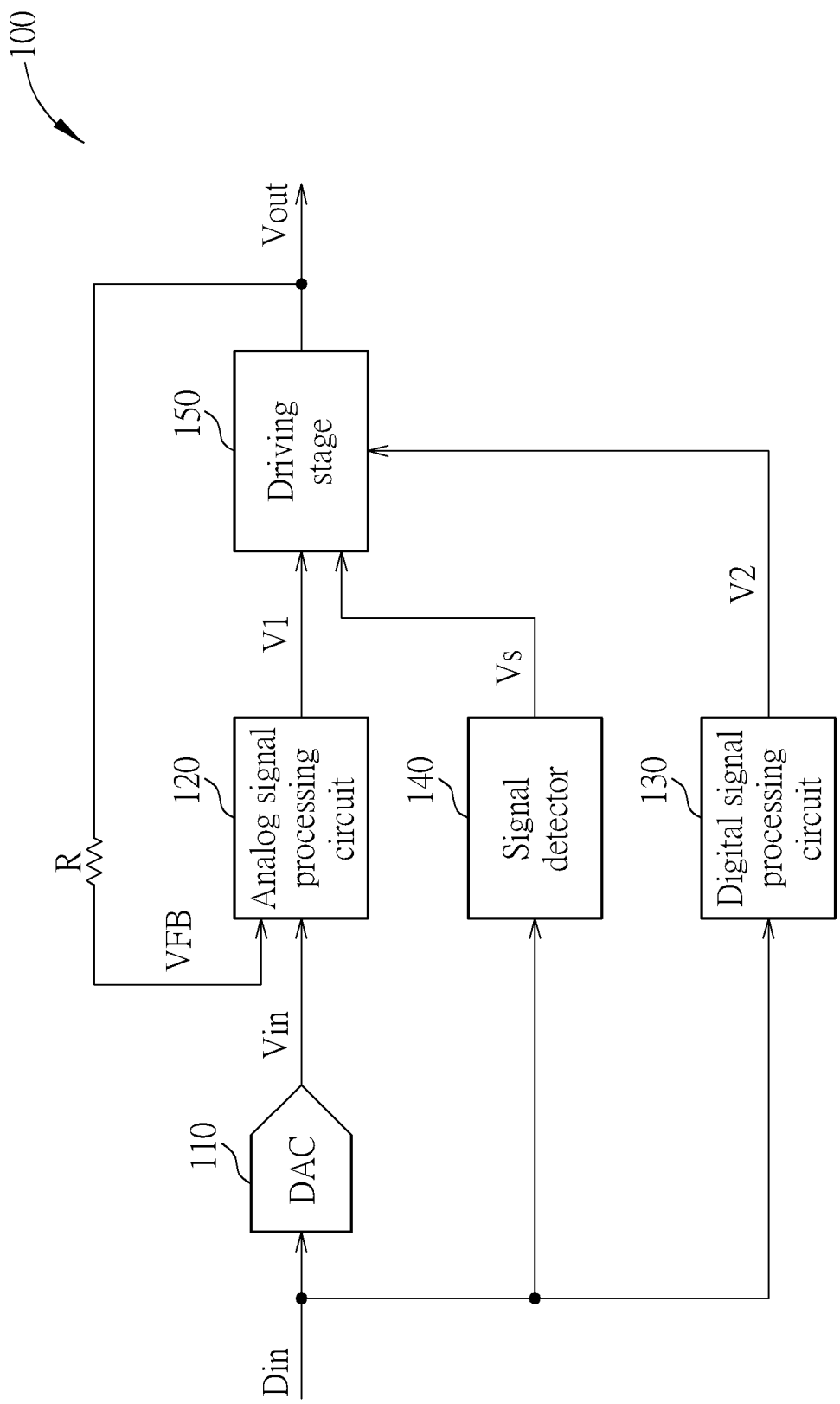
FIG. 1 is a diagram illustrating an amplifier according to one embodiment of the present invention.

FIG. 1 is a diagram illustrating an amplifier 100 according to one embodiment of the present invention. As shown in FIG. 1, the amplifier 100 comprises a DAC 110, an analog signal processing circuit 120, a digital signal processing circuit 130, a signal detector 140, a driving stage 150 and a feedback circuit (in this embodiment, a resistor R serves as the feedback circuit). In this embodiment, the amplifier 100 may be a class-D amplifier built within an electronic device capable of providing an audio output, and the amplifier 100 may be configured to receive a digital input signal (audio signal) Din to generate an output signal Vout to drive a speaker or an earphone or a headset.

In the operations of the amplifier 100, the DAC 110 receives the digital input signal Din and performs a digital-to-analog conversion operation on the digital input signal Din to generate an analog input signal Vin, and the analog signal processing circuit 120 processes the analog input signal Vin and a feedback signal VFB to generate a first processed signal V1 to the driving stage 150. The digital signal processing circuit 130 receives the digital input signal Din and processes the digital input signal Din to generate a second processed signal V2. In addition, the signal detector 140 detects strength of the digital input signal Din to generate a mode selection signal Vs, wherein the mode selection signal Vs is used to indicate a closed-loop mode or an open-loop mode of the amplifier 100. In this embodiment, because the digital input signal Din is the audio signal, the signal detector 140 can obtain volume of the audio signal from the digital data to serve as the strength of the digital input signal Din. In addition, when the signal detector 140 detects that the digital input signal Din has large strength (e.g. the strength is greater than a threshold value), the mode selection signal Vs indicates the closed-loop mode; and when the signal detector 140 detects that the digital input signal Din has smaller strength (e.g. the strength is lower than a threshold), the mode selection signal Vs indicates the open-loop mode.

Then, the driving stage 150 refers to the mode selection signal Vs to select one of the first processed signal V1 and the second processed signal V2 to generate the output signal Vout. In this embodiment, when the mode selection signal Vs indicates the closed-loop mode, the DAC 110 and the analog signal processing circuit 120 are enabled so that the analog signal processing circuit 120 generates the first processed signal V1, and the driving stage 150 receives the first processed signal V1 to generate the output signal Vout. Meanwhile, the digital signal processing circuit 130 may be disabled or powered down to reduce the power consumption. When the mode selection signal Vs indicates the open-loop mode, the digital signal processing circuit 130 is enabled to generate the second processed signal V2, and the driving stage 150 receives the second processed signal V2 to generate the output signal Vout. Meanwhile, the analog signal processing circuit 120 may be disabled or powered down to reduce the power consumption.

In this embodiment, the analog signal processing circuit 120 has a closed-loop design, that is the feedback signal VFB generated by the output signal Vout is used to compensate the analog input signal Vin, so the performance of the output signal Vout is better and the amplifier 100 has good total harmonic distortion when the mode selection signal Vs indicates the closed-loop mode. Furthermore, efficiency of the class-D amplifier is good when the output signal Vout delivers a large output power, so the amplifier 100 can work well. In addition, the digital signal processing circuit 130 generates the second processed signal V2 by using the digital input signal Din without using any feedback signal obtained from the output signal Vout, so the driving stage 150 will have less quiescent current; that means the amplifier 100 can have a better efficiency at a small output power condition. Therefore, by controlling the amplifier 100 to operate in the closed-loop mode or the open-loop mode based on the strength of the digital input signal Din (i.e. the power of the output signal Vout), the amplifier 100 can always have a good power efficiency over the whole output power levels.

Figure 2:
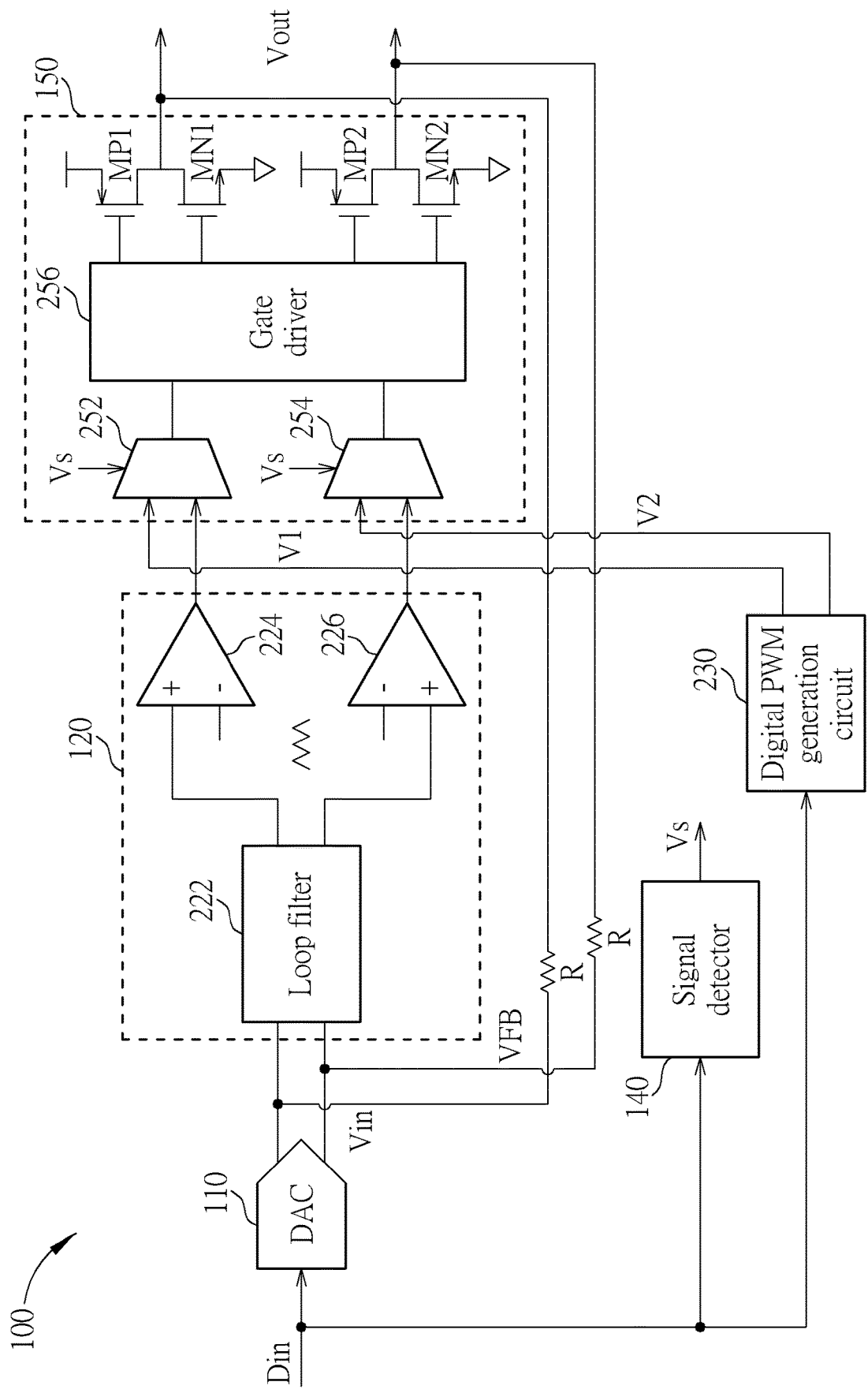
FIG. 2 is a diagram illustrating a detailed structure of the amplifier shown in FIG. 1 according to one embodiment of the present invention.

FIG. 2 is a diagram illustrating a detailed structure of the amplifier 100 according to one embodiment of the present invention. As shown in FIG. 2, the analog signal processing circuit 120 comprises a loop filter 222 and a PWM generation circuit comprising two comparators 224 and 226. The driving stage 150 comprises two multiplexer 252 and 254, a gate driver 256 and an output stage comprising P-type transistors MP1 and MP2 and N-type transistors MN1 and MN2. The digital signal processing circuit 130 is implemented by a digital PWM generation circuit 230. It is noted that the amplifier 100 shown in FIG. 2 has a differential structure, that is each of the analog input signal Vin, the first processed signal V1, the second processed signal V2, the feedback signal VFB and the output signal Vout is a differential signal.

In the operation of the analog signal processing circuit 120, the loop filter 222 may comprise a plurality of integrators configured to filter the analog input signal Vin to generate a filtered signal, and each of the comparators 224 and 226 compares the filtered signal with a saw-tooth signal to generate a PWM signal serving as the first processing signal V1. In the operation of the digital PWM generation circuit 230, the digital PWM generation circuit 230 may use a sigma-delta modulator to generate digital data, and then use a digital comparator to compare the digital data with triangle reference data to generate a PWM signal serving as the second processed signal V2. In the operation of the driving stage 150, each of the multiplexers 252 and 254 refers to the mode selection signal Vs to select one of the first processed signal V1 and the second processed signal V2. The gate driver 256 receives the first processed signal V1 or the second processed signal V2 to drive the output stages, for producing the output signal Vout.

It is noted that the elements within the analog signal processing circuit 120, the digital PWM generation circuit 230 and the driving stage 150 are for illustrative purposes only. As long as the analog signal processing circuit 120 and the digital PWM generation circuit 230 can generate PWM signals for the driving stage 150, and the driving stage 150 can refer to the mode selection signal Vs to select one of the first processed signal V1 and the second processed signal V2 for generating the output signal Vout, the internal circuit designs can be determined by an engineer.

Figure 3:
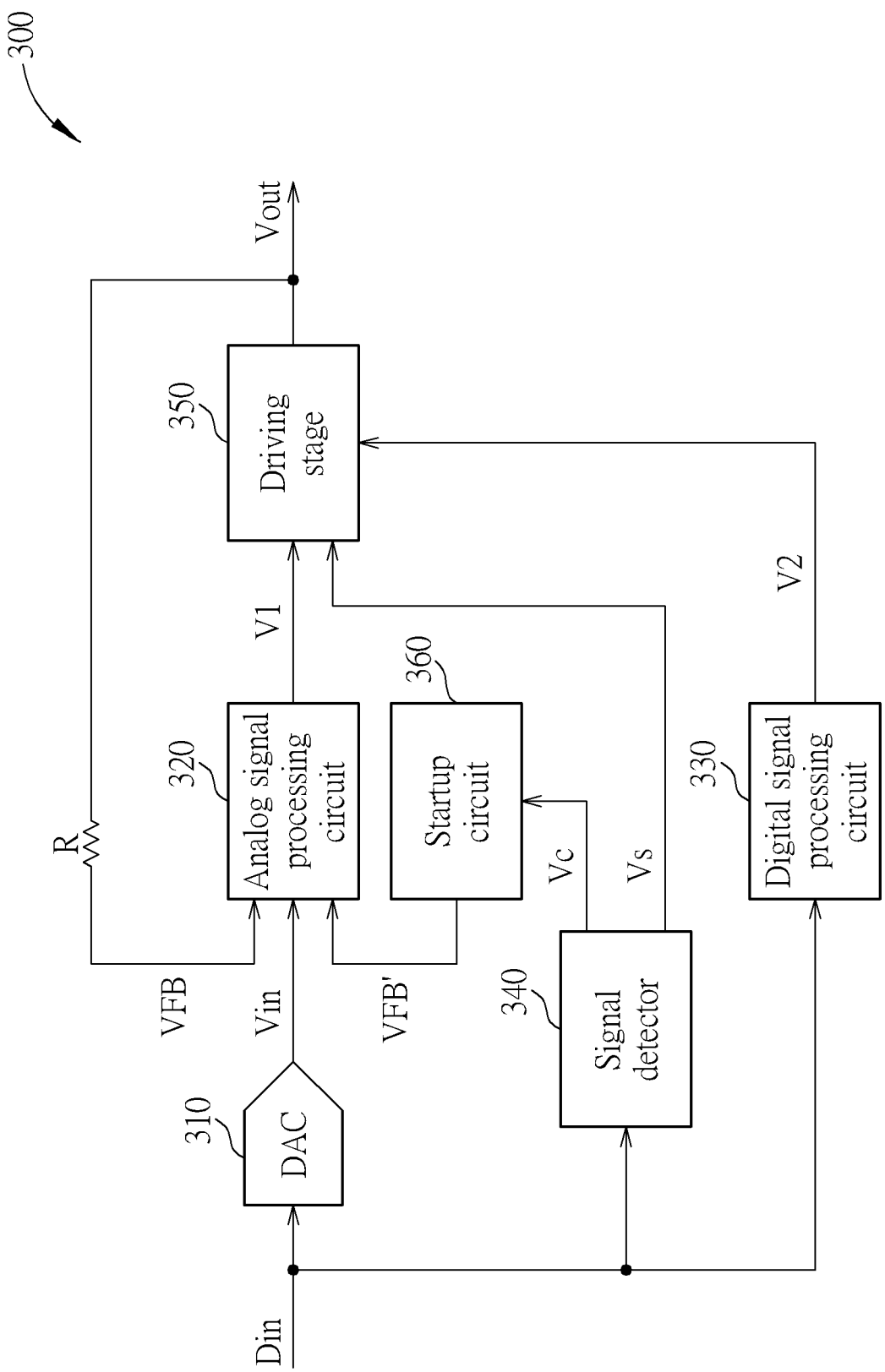
FIG. 3 is a diagram illustrating an amplifier according to one embodiment of the present invention.

FIG. 3 is a diagram illustrating an amplifier 300 according to one embodiment of the present invention. As shown in FIG. 3, the amplifier 300 comprises a DAC 310, an analog signal processing circuit 320, a digital signal processing circuit 330, a signal detector 340, a driving stage 350, a startup circuit 360 and a feedback circuit (in this embodiment, a resistor R serves as the feedback circuit). In this embodiment, the amplifier 300 may be a class-D amplifier built within an electronic device capable of providing an audio output, and the amplifier 300 may be configured to receive a digital input signal (audio signal) Din to generate an output signal to drive a speaker, an earphone or a headset.

In the operations of the amplifier 300, the DAC 310 receives the digital input signal Din and performs a digital-to-analog conversion operation on the digital input signal Din to generate an analog input signal Vin, and the analog signal processing circuit 320 processes the analog input signal Vin and a feedback signal VFB to generate a first processed signal V1 to the driving stage 350. The digital signal processing circuit 330 receives the digital input signal Din and processes the digital input signal Din to generate a second processed signal V2. In addition, the signal detector 340 detects strength of the digital input signal Din to generate a mode selection signal Vs, wherein the mode selection signal Vs is used to indicate a closed-loop mode or an open-loop mode of the amplifier 300. In this embodiment, because the digital input signal Din is the audio signal, the signal detector 340 can obtain volume of the audio signal from the digital data to serve as the strength of the digital input signal Din. In addition, when the signal detector 340 detects that the digital input signal Din has large strength (e.g. the strength is greater than a threshold value), the mode selection signal Vs indicates the closed-loop mode; and when the signal detector 340 detects that the digital input signal Din has smaller strength (e.g. the strength is lower than a threshold), the mode selection signal Vs indicates the open-loop mode.

Then, the driving stage 350 refers to the mode selection signal Vs to select one of the first processed signal V1 and the second processed signal V2 to generate the output signal Vout. In this embodiment, when the mode selection signal Vs indicates the closed-loop mode, the DAC 310 and the analog signal processing circuit 320 are enabled so that the analog signal processing circuit 320 generates the first processed signal V1, and the driving stage 350 receives the first processed signal V1 to generate the output signal Vout. Meanwhile, the digital signal processing circuit 330 may be disabled or powered down to reduce the power consumption. When the mode selection signal Vs indicates the open-loop mode, digital signal processing circuit is enabled to generate the second processed signal V2, and the driving stage 350 receives the second processed signal V2 to generate the output signal Vout. Meanwhile, the analog signal processing circuit 320 may be disabled or powered down to reduce the power consumption.

In this embodiment, the analog signal processing circuit 320 has a closed-loop design, that is the feedback signal VFB generated by the output signal Vout is used to compensate the analog input signal Vin, so the performance of the output signal Vout is better and the amplifier 300 has good total harmonic distortion when the mode selection signal Vs indicates the closed-loop mode. Furthermore, efficiency of the class-D amplifier is better when the output signal Vout has large power, so the amplifier 300 can work well. In addition, the digital signal processing circuit 330 generates the second processed signal V2 by using the digital input signal Din without using any feedback signal obtained from the output signal Vout, the driving stage 350 will have less quiescent current, that is the amplifier 300 has better efficiency.

In addition, because the analog signal processing circuit 320 having the closed-loop design needs more settling time to generate the stable first processed signal, the amplifier 300 may have a switching glitch when the mode selection signal Vs switches from the open-loop mode to the closed-loop mode. In order to reduce this switching glitch issue, the startup circuit 360 is enabled to initialize the analog signal processing circuit 320 before the amplifier 300 actually switches to the closed-loop mode. Specifically, Assuming that the amplifier 300 operates in the open-loop mode and the analog signal processing circuit 320 is disabled, if the signal detector 340 detects that the strength of the digital input signal Din becomes larger (i.e. the power of the output signal Vout will become larger after a while), firstly, the analog signal processing circuit 320 is controlled to be enabled (e.g. by the signal detector 340 or other circuits), and the signal detector 340 can generate a control signal Vc to enable the startup circuit 360 to initialize the analog signal processing circuit 320, for example, the startup circuit 360 generates a feedback signal VFB' to the input terminal of the analog signal processing circuit 320 to initialize the analog signal processing circuit 320. After the analog signal processing circuit 320 is initialized, the signal detector 340 starts to generate the mode selection signal Vs indicating the closed-loop mode to make the driving stage 350 receive the stable first processed signal V1 to generate the output signal Vout.

In light of above, by controlling the amplifier 300 to operate in the closed-loop mode or the open-loop mode based on the strength of the digital input signal Din (i.e. the power of the output signal Vout), the amplifier 300 can always have enough power efficiency. In addition, by further providing the startup circuit 360 to initialize the analog signal processing circuit 320 before the mode selection signal Vs switches from the open-loop mode to the closed-loop mode, the switching glitch issue can be improved.

Figure 4:
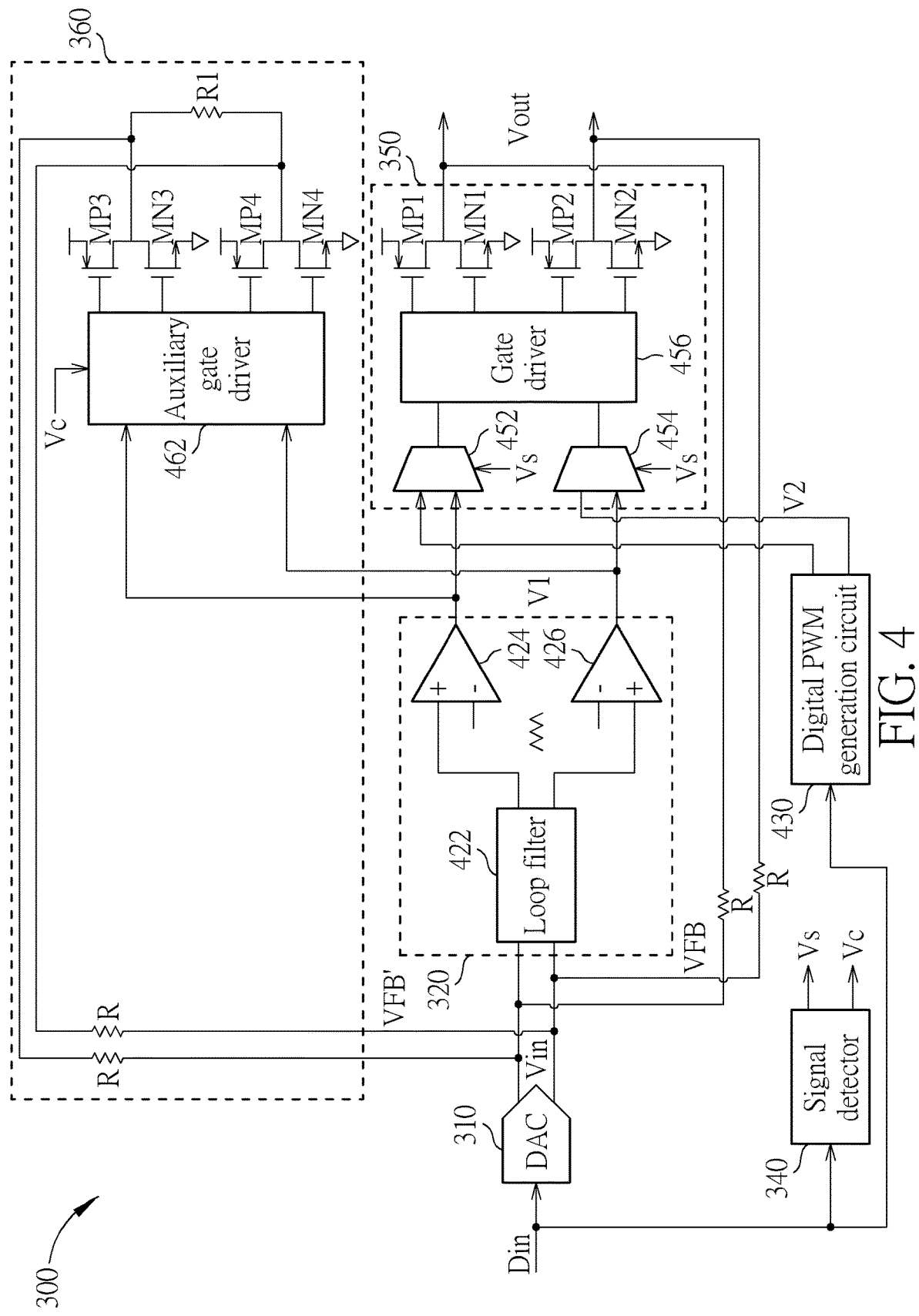
FIG. 4 is a diagram illustrating a detailed structure of the amplifier shown in FIG. 3 according to one embodiment of the present invention.

FIG. 4 is a diagram illustrating a detailed structure of the amplifier 300 according to one embodiment of the present invention. As shown in FIG. 4, the analog signal processing circuit 320 comprises a loop filter 422 and a PWM generation circuit comprising two comparators 424 and 426, the driving stage 350 comprises two multiplexer 452 and 454, a gate driver 456 and an output stage including P-type transistors MP1 and MP2 and N-type transistors MN1 and MN2. The digital signal processing circuit 330 is implemented by a digital PWM generation circuit 430. The startup circuit 360 comprises an auxiliary gate driver 462 and another output stage including P-type transistors MP3 and MP4 and N-type transistors MN3 and MN4, an output resistor R1 and feedback circuits (in this embodiment, two resistors R serve as the feedback circuits). It is noted that the amplifier 300 shown in FIG. 4 has a differential structure, that is each of the analog input signal Vin, the first processed signal V1, the second processed signal V2, the feedback signal VFB, the feedback signal VFB' and the output signal Vout is a differential signal.

In the operation of the analog signal processing circuit 320, the loop filter 422 may comprise a plurality of integrators configured to filter the analog input signal Vin to generate a filtered signal, and each of the comparators 424 and 426 compares the filtered signal with a saw-tooth signal to generate a PWM signal serving as the first processing signal V1. In the operation of the digital PWM generation circuit 430, the digital PWM generation circuit 430 may use a sigma-delta modulator to generate digital data, and use a digital comparator to compare the digital data with triangle reference data to generate a PWM signal serving as the second processed signal V2. In the operation of the driving stage 350, each of the multiplexers 452 and 454 refers to the mode selection signal Vs to select one of the first processed signal V1 and the second processed signal V2. The gate driver 456 receives the first processed signal V1 or the second processed signal V2 to drive the output stage (MP1, MN1, MP2 and MN2) for producing the output signal Vout. In the operation of the startup circuit 360, the auxiliary gate driver 462 receives the first processed signal V1 to drive the other output stage (MP3, MN3, MP4 and MN4) for the generation of the feedback signal VFB'.

It is noted that the elements within the analog signal processing circuit 320, the digital PWM generation circuit 430, the driving stage 350 and the startup circuit 360 are for illustrative purposes only. As long as the analog signal processing circuit 320 and the digital PWM generation circuit 430 can generate PWM signals to the driving stage 350, the driving stage 350 can refer to the mode selection signal Vs to select one of the first processed signal V1 and the second processed signal V2 to generate the output signal Vout, and the startup circuit 360 can receive the first processed signal V1 to generate the feedback signal VFB' to initialize the analog signal processing circuit 320, the internal circuit designs can be determined by an engineer.

Figure 5:
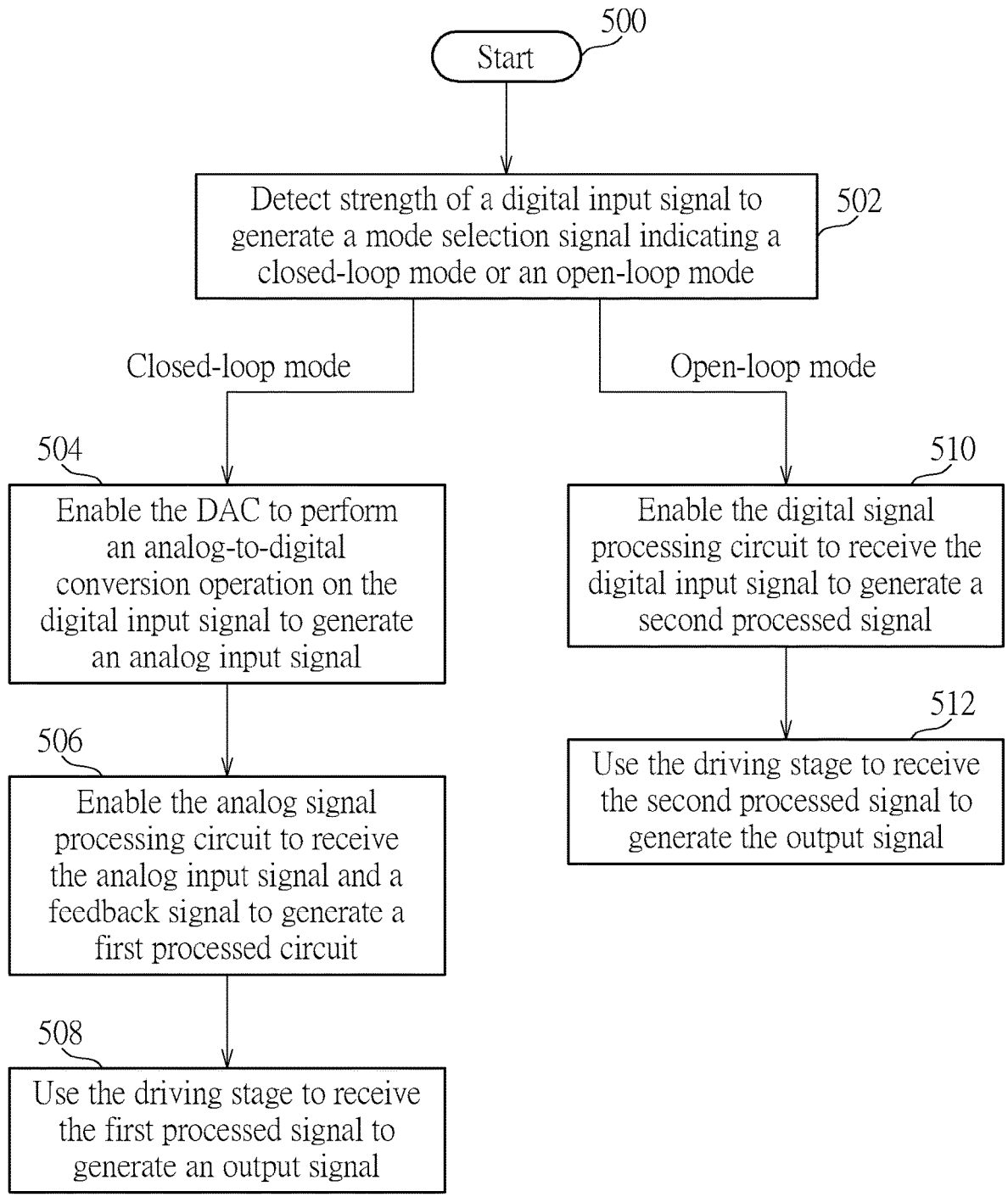
FIG. 5 is a flowchart of a method for controlling an amplifier according to one embodiment of the present invention.

FIG. 5 is a flowchart of a method for controlling an amplifier according to one embodiment of the present invention. Referring FIGS. 1-5 and above description, the flow is described as follows.

Step 500: the flow starts.

Step 502: detect strength of a digital input signal to generate a mode selection signal indicating a closed-loop mode or an open-loop mode. When the mode selection signal indicates the closed-loop mode, the flow enters Step 504; when the mode selection signal indicates the open-loop mode, the flow enters Step 510.

Step 504: enable the DAC to perform an analog-to-digital conversion operation on the digital input signal to generate an analog input signal.

Step 506: enable the analog signal processing circuit to receive the analog input signal and a feedback signal to generate a first processed circuit.

Step 508: use the driving stage to receive the first processed signal to generate an output signal.

Step 510: enable the digital signal processing circuit to receive the digital input signal to generate a second processed signal.

Step 512: use the driving stage to receive the second processed signal to generate the output signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier, comprising:
a digital-to-analog converter (DAC), configured to perform a digital-to-analog conversion operation on a digital input signal to generate an analog input signal;
an analog signal processing circuit, coupled to the DAC, configured to generate a first processed signal according to the analog input signal and a feedback signal;
a digital signal processing circuit, configured to process the digital input signal to generate a second processed signal;
a signal detector, configured to detect strength of the digital input signal to generate a mode selection signal; and
a driving stage, coupled to the analog signal processing circuit, the digital signal processing circuit and the signal detector, configured to refer to the mode selection signal to receive one of the first processed signal and the second processed signal to generate an output signal, wherein the feedback signal is generated according to the output signal.

2. The amplifier of claim 1, wherein when the mode selection signal indicates a closed-loop mode, the analog signal processing circuit uses the feedback signal to compensate the analog signal to generate the first processed signal, and the driving stage receives the first analog signal to generate the output signal; and when the mode selection signal indicates an open-loop mode, the digital signal processing circuit processes the digital input signal to generate the second processed signal, and the driving stage receives the second analog signal to generate the output signal.

3. The amplifier of claim 2, wherein when the mode selection signal indicates the open-loop mode, the analog signal processing circuit is disabled.

4. The amplifier of claim 2, wherein when the mode selection signal indicates the closed-loop mode, the digital signal processing circuit is disabled.

5. The amplifier of claim 1, wherein the analog signal processing circuit comprises:
a loop filter, configured to filter the analog input signal to generate a filtered signal; and
a pulse-width modulation (PWM) generation circuit, configured to receive the filtered signal to generate a PWM signal serving as the first processed signal;
wherein the digital signal processing circuit comprises a digital PWM generation circuit configured to receive the digital input signal to generate another PWM signal serving as the second processed signal.

6. The amplifier of claim 1, further comprising:
a startup circuit, coupled to the analog signal processing circuit, configured to initialize the analog signal processing circuit.

7. The amplifier of claim 6, wherein when the mode selection signal switches from the open-loop mode to the closed-loop mode, the startup circuit is enabled to initialize the analog signal processing circuit, then the driving stage selects the first processed signal and processes the first processed signal to generate the output signal.

8. The amplifier of claim 7, wherein when the startup circuit is enabled, the startup circuit receives the first processed signal to generate another feedback signal to an input terminal of the analog signal processing circuit, to initialize the analog signal processing circuit.

9. The amplifier of claim 1, wherein the amplifier is a class-D amplifier, and the digital input signal is an audio signal.

10. A method for controlling an amplifier, wherein the amplifier comprises a digital-to-analog converter (DAC), an analog signal processing circuit, a digital signal processing circuit and a driving stage, and the method comprises the steps of:
detecting strength of a digital input signal to generate a mode selection signal indicating a closed-loop mode or an open-loop mode;
when the mode selection signal indicates the closed-loop mode:
enabling the DAC to perform an analog-to-digital conversion operation on the digital input signal to generate an analog input signal;
enabling the analog signal processing circuit to receive the analog input signal and a feedback signal to generate a first processed circuit; and
using the driving stage to receive the first processed signal to generate an output signal, wherein the feedback signal is generated according to the output signal; and
when the mode selection signal indicates the open-loop mode:
enabling the digital signal processing circuit to receive the digital input signal to generate a second processed signal; and
using the driving stage to receive the second processed signal to generate the output signal.

11. The method of claim 10, further comprising:
when the mode selection signal indicates the open-loop mode:
disabling the analog signal processing circuit.

12. The method of claim 10, further comprising:
when the mode selection signal indicates the closed-loop mode:
disabling the digital signal processing circuit.

13. The method of claim 10, wherein each of the first processed signal and the second processed signal is a pulse-width modulation (PWM) signal.

14. The method of claim 10, further comprising:
when the mode selection signal switches from the open-loop mode to the closed-loop mode:
enabling a startup circuit to initialize the analog signal processing circuit, then using the driving stage to process the first processed signal to generate the output signal.

15. The method of claim 14, wherein the step of enabling the startup circuit to initialize the analog signal processing circuit comprises:
enabling the startup circuit to receive the first processed signal to generate another feedback signal to an input terminal of the analog signal processing circuit, to initialize the analog signal processing circuit.

16. The method of claim 10, wherein the amplifier is a class-D amplifier, and the digital input signal is an audio signal.

\* \* \* \* \*